US009432009B2

(12) United States Patent
Whatmough et al.

(10) Patent No.: US 9,432,009 B2
(45) Date of Patent: Aug. 30, 2016

(54) CIRCUIT DELAY MONITORING APPARATUS AND METHOD

(71) Applicant: ARM Limited, Cambridge (GB)

(72) Inventors: Paul Nicholas Whatmough, Cambridge (GB); Shidhartha Das, Norwich (GB); David Michael Bull, Cambridge (GB)

(73) Assignee: ARM Limited, Cambridge (GB)

( * ) Notice: Subject to any disclaimer, the term of this patent is extended or adjusted under 35 U.S.C. 154(b) by 258 days.

(21) Appl. No.: 14/081,900

(22) Filed: Nov. 15, 2013

(65) Prior Publication Data
US 2015/0137864 A1 May 21, 2015

(51) Int. Cl.
H03L 7/00 (2006.01)
H03K 5/135 (2006.01)

(52) U.S. Cl.
CPC .................................... *H03K 5/135* (2013.01)

(58) Field of Classification Search
CPC ........................................................ H03K 5/135
USPC ........................................................... 327/160
See application file for complete search history.

(56) References Cited

U.S. PATENT DOCUMENTS 9,092,013 B2 * 7/2015 Song ..................... G04F 10/005
2009/0303091 A1 * 12/2009 Rivoir ................... G04F 10/005
341/120

OTHER PUBLICATIONS

Staszewski et al., "1.3 V 20 ps Time-to-Digital Converter for Frequency Synthesis in 90-nm CMOS", *IEEE Transactions on Circuits and Systems*, vol. 53, No. 3, Mar. 2006, pp. 220-224.
Bowman et al., "All-Digital Circuit-Level Dynamic Variation Monitor for Silicon Debug and Adaptive Clock Control", *IEEE Transactions on Circuits and Systems*, vol. 58, No. 9, Sep. 2011, pp. 2017-2025.
Franch et al., "On-chip Timing Uncertainty Measurements on IBM Microprocessors", *IBM Research*, 7 pages.
Restle et al., "Timing Uncertainty Measurements on the Power5 Microprocessor", *ISSCC 2004/Session 19/Clock Generation and Distribution*, 19.7, 2004, 8 pages.
Alon et al., "Circuits and Techniques for High-Resolution Measurement of On-Chip Power Supply Noise", *IEEE Journal of Solid-State Circuits*, vol. 40, No. 4, Apr. 2005, pp. 820-828.

* cited by examiner

*Primary Examiner* — Sibin Chen
*Assistant Examiner* — Metasebia Retebo
(74) *Attorney, Agent, or Firm* — Pramudji Law Group PLLC; Ari Pramudji

(57) ABSTRACT

A circuit delay monitoring apparatus has a ring oscillator with a plurality of delay elements, a signal transition being propagated through the delay elements of the ring oscillator, and a plurality N of sampling points being distributed around the ring oscillator. Selection circuitry selects, in dependence on the indication of the current location of the signal transition generated by the fine sampling circuitry, one of the M transition counter circuits whose associated location is greater than said predetermined amount from the current location of the signal transition. Output generation circuitry then generates a count indication for a reference time period dependent on a sampled count value of the transition counter circuit selected by the selection circuitry, the indication of the current location of the signal transition within the ring oscillator, and reference count data relating to the start of the reference time period.

19 Claims, 7 Drawing Sheets

CIRCUIT DELAY MONITORING APPARATUS AND METHOD

BACKGROUND OF THE INVENTION

1. Field of the Invention

The present invention relates to a circuit delay monitoring apparatus, and to a method of monitoring circuit delay.

2. Description of the Prior Art

There are many instances where it is desired on-chip to monitor circuit delay. For example, such a monitored circuit delay can be used to deduce a time interval, or give an indication of voltage, temperature or process variation, and is a mechanism used in a wide range of circuits within microprocessors and System-on-Chip (SoC) products, such as phase lock loop circuits (PLLs), delay lock loop circuit (DLLs), memory interface circuits, analogue to digital converters, temperature sensors, process monitors, etc.

Traditionally, such circuit delay monitoring has been performed using either analog circuits or mixed signal circuits (i.e. circuits that use a mixture of analog and digital signals). While such techniques can give accurate results, it is becoming increasingly challenging to incorporate such analog or mixed signal circuits as the process geometry of microprocessors and SoC products decreases. As process geometries shrink, it is also becoming more and more common to reduce the supply voltages used, and this reduction in supply voltages is one factor contributing to the difficulties in using traditional analog and mixed signal circuits to perform circuit delay monitoring.

Accordingly, it is becoming more common to use all digital circuitry in order to provide such circuit delay monitoring functionality. In accordance with such digital techniques, the number of gate delays traversed by a signal in a given time interval can be measured. This can be used in order to directly measure a time interval, often referred to as a time-to-digital (TDC) conversion, or to indirectly observe quantities such as voltage, temperature or process strength (e.g. to detect whether the part of the apparatus in which the circuit delay monitoring function is provided is at a fast or a slow process corner).

A first known digital technique for performing circuit delay monitoring has the general form shown in FIG. 1. In accordance with this technique, a linear delay line is formed by a plurality of delay elements 12, 14, 16, 18, 20, in this example the delay elements being inverters. A sampling point is provided between each delay element, so that if there are N delay elements there will be N sampling points. Sampling circuitry 25 is then provided that would typically include a flip-flop for each sampling point in order to enable the signal value at that sampling point to be sampled. This sampling circuitry is driven by a clock signal fs, and that clock signal is also provided to a drive element 10 used to insert a signal transition into the linear delay line.

In accordance with this technique, on a first rising edge of a clock signal, the signal transition can be inserted into the delay line by the element 10, and then on a following rising edge of the clock signal, the current value at each of the sampling points can be sampled by the sampling circuitry 25. The values as sampled are then provided to the thermometer-to-binary circuitry 30, in order to generate an output code identifying the number of delay elements traversed by the signal transition within the clock period.

Due to inverters being used as the delay elements in this example, additional inverters 35, 37 will be provided in every alternate flip-flop output of the sampling circuits 25.

The input to the thermometer-to-binary circuitry 35 will hence be a binary string of bits, where a first sequence of the bits has a first value (either a logic 0 or a logic 1 value), and a second sequence of bits then has the opposite value (i.e. a logic 1 or a logic 0 value). The position of the transition between those two sequences then indicates how far the signal transition has gone through the linear delay line in the clock cycle, and a code will be output whose value is dependent on the position of the transition between the two sequences.

Hence, purely by way of example, if the drive element 10 introduced a logic 0 to logic 1 transition into the delay line, then this will result in the output from delay element 12 transitioning to a logic 0 value, followed by the output from the inverter 14 transitioning to a logic 1 value, followed by the output from inverter 16 transitioning to a logic 0 value, etc. For each inverter that the signal transition passes through prior to the next rising edge of the clock cycle, it will be appreciated that a logic 0 value will be provided to the thermometer-to-binary circuitry 30 after the sampling circuitry 25 has sampled the sampling points on the next rising edge of the clock. However, for any delay elements not yet traversed by the signal transition, a logic 1 value will instead be provided to the thermometer-to-binary circuitry 30. Accordingly, it can be seen that the input to the circuitry 30 will comprise a series of logic 0 values, followed by a number of logic 1 values, with the transition point identifying how far along the delay line the signal transition has passed in the clock cycle. This thermometer indication as evaluated by the circuitry 30 can then be converted into a more compact binary encoding to be output from the circuitry 30.

The dynamic range of such a linear delay line is limited, since the delay line is of a fixed length, and the signal transition must not extend beyond the end of the delay line within the reference time period, in the above example the reference time period being the period between consecutive rising edges of the clock signal fs. However, the resolution is quite high. In particular, it will be appreciated that the flip-flops within the sampling circuitry 25 have certain set-up and hold timing requirements, whereby if the signal of the associated sampling point changes within the set-up or hold timing window, an incorrect or metastable value may be captured by the associated flip-flop.

The outputs of the inverters in the delay line will be changing asynchronously with the clock signal fs, and hence there is a prospect of an output changing during a set-up or hold timing window. However, at any point in time, there will only be one, or possibly a few, inverters whose outputs are changing in the setup or hold timing windows, and hence the value captured will be accurate to within one or a few delay element positions. Any such inaccuracies may result in a "bubble" in the output code, but it is possible in some instances to correct certain bubble patterns.

The article by Staszewski et al entitled "1.3V 20 ps time-to-digital converter for frequency synthesis in 90 nm CMOS", IEEE Transactions on Circuits and Systems II: Express Briefs, Volume 53, Number 3, March 2006, pages 220 to 224, provides an illustration of a basic linear delay line approach of the above-described type, which is used in the described article as a TDC for a PLL. The following three articles then provide applications of the topology in the above article, applied to on-chip PVT characterisation:

1. Bowman et al, "All-digital Circuit-Level Dynamic Variation Monitor for Silicon Debug and Adaptive Clock Control, IEEE Transactions on Circuits and Systems I:Regular papers, Volume 58, Number 9, pages 2017 to 2025, September 2011;

2. Restle et al, "Timing Uncertainty Measurements on the Power5 Microprocessor", 2004 IEEE International Solid-State Circuits Conference, Digest of Technical papers, Session 19, Clock Generation and Distribution, 19.7;

3. Franch et al, "On-chip Timing Uncertainty Measurements on IBM Microprocessors", IEEE International Test Conference, 2008, pages 1 to 7, 28 to 30 Oct. 2008.

All of the above mentioned articles use a linear topology with a limited dynamic range.

Another known prior art technique is illustrated in FIG. 2. In accordance with this technique, a ring oscillator 50 is formed consisting of a plurality of delay elements 52, 54, 56, 58, 60. As with the FIG. 1 example, the delay elements in the illustrated embodiment are inverters. An edge counter 65 is used to increment a count value each time a signal transition passes the point that the edge counter taps into the ring oscillator. The edge counter will typically be formed as a dual edge counter (for example, using both rising-edge and falling-edge counters), since there will be an odd number of inverters within the ring oscillator, and according on one cycle the transition observed by the edge counter will be a logic 0 to logic 1 transition, but on the next iteration around the ring oscillator the transition will be a logic 1 to a logic 0 transition at the tap point of the edge counter 65.

Sampling circuitry 70 is then driven by a clock signal to sample the current count value of the edge counter 65, for example on each rising edge of the clock signal. The sample value is then provided to differentiation circuitry 75, which is also activated by the clock signal, and compares a currently provided output from the sampling circuitry with the previous sampled output in order to determine the difference between those count values, and hence the number of times around the ring oscillator that the signal transition has passed in the intervening period. This value can then be multiplied by N using multiplier 80, where N is the number of delay elements in the ring oscillator, in order to produce a code identifying the number of delay elements traversed by the signal transition in the reference time period (in this example between consecutive rising edges of the clock signal).

The benefit of the approach of FIG. 2 is that it has a large dynamic range, limited by the number of stages in the edge counter but the resolution is typically poor due to limitations in the maximum frequency of the counter.

As discussed earlier with reference to FIG. 1, flip-flops will have certain set-up and hold timing requirements, and accordingly the flip-flops within the sampling circuitry 70 will potentially store an incorrect or metastable value if the output of the edge counter is changing within such set-up or hold timing windows. To minimise this error, a grey encoding can be used to ensure that only one bit differs between consecutive codes. However, this still implies that glitches of magnitude N can appear in the output wave form. This can make the scheme impractical for many applications, and is a disadvantage compared to the linear topology of FIG. 1, which can provide a more accurate value, albeit with a more limited dynamic range.

The article by Alon et al entitled "Circuits and techniques for high-resolution measurement of on-chip power supply noise", IEEE Journal of Solid-State Circuits, Volume 40, Number 4, pages 820 to 828, April 2005, describes a configuration similar to FIG. 2. In order to alleviate the earlier-mentioned accuracy problems with the FIG. 2 approach, the technique described in this article averages the output codes generated by the circuitry over a relatively long period of time, in order to average out such glitches of magnitude N. Whilst this can result in an accurate value being obtained, it requires a significant amount of time to develop that accurate value, which makes it impractical in many situations, for example where it is desired to track variations occurring over shorter time periods.

Accordingly, it would be desirable to provide an improved mechanism for monitoring circuit delay.

SUMMARY OF THE INVENTION

Viewed from a first aspect, the present invention provides a circuit delay monitoring apparatus comprising: a ring oscillator comprising a plurality of delay elements, a signal transition being propagated through the delay elements of the ring oscillator; a plurality N of sampling points distributed around the ring oscillator; fine sampling circuitry configured to sample signal values at each of the plurality of sampling points under control of a reference clock signal, in order to generate an indication of a current location of the signal transition within the ring oscillator; coarse sampling circuitry comprising M transition counter circuits, where M is at least 2 and less than N, each transition counter circuit being connected to an associated location within the ring oscillator and configured to increment a count value each time the signal transition passes the associated location, the coarse sampling circuitry being configured to sample the count value under control of the reference clock signal, the M transition counter circuits being connected to the ring oscillator so that, at any point in time, the separation between the current location of the signal transition and the associated location of at least one of said M transition counter circuits will be greater than a predetermined amount; selection circuitry configured to select, in dependence on the indication of the current location of the signal transition generated by the fine sampling circuitry, one of said M transition counter circuits whose associated location is greater than said predetermined amount from the current location of the signal transition; and output generation circuitry configured to generate a count indication for a reference time period dependent on a sampled count value of the transition counter circuit selected by the selection circuitry, the indication of the current location of the signal transition within the ring oscillator, and reference count data relating to the start of the reference time period.

In accordance with the present invention, multiple transition counter circuits are connected to a ring oscillator at different locations, and each counter circuit increments a count value each time the signal transition passes the location at which that counter is connected to the ring oscillator. The locations at which the transition counter circuits are connected to the ring oscillator are chosen such that at any point in time, the separation between a current location of the signal transition as determined by fine sampling circuitry, and the location that at least one of the transition counter circuits is connected to the ring oscillator, is greater than a predetermined amount. This means that at any point in time there will always be at least one transition counter circuit whose output will not be changing at the time it is sampled by the coarse sampling circuitry.

Selection circuitry uses the indication of the current location of the signal transition as generated by the fine sampling circuitry to select one of the transition counter circuits whose associated connection to the ring oscillator is greater than the predetermined amount away from the current location of the signal transition, and hence whose output can be trusted to be correct. Output generation circuitry then generates a counter indication for a reference time period using the sampled count value of the transition counter selected by the selection circuitry, the indication of the current location of the signal transition within the ring oscillator, and certain reference count data relating to the start of the reference time period.

The reference count data can be predetermined in certain embodiments, but in an alternative embodiment the reference count data may be determined by previously sampled data obtained by the fine sampling circuitry and the coarse sampling circuitry. By such an approach, a circuit delay monitoring apparatus can be produced that has a large dynamic range due to the use of a ring oscillator, and which can provide an accurate counter indication without needing to average multiple outputs over a long period of time. In particular, each count indication produced can be treated as an accurate indication of the number of delay elements that the signal transition has propagated through within the reference time period.

In one embodiment, the reference count data relating to the start of the reference time period comprises an initial count value, and the output generation circuitry is configured to determine a change in the count value during the reference time period by comparing the sampled count value of the transition counter circuit selected by the selection circuitry with the initial count value.

The initial count value can be determined in a variety of ways. For example, it may be initialised to a known value, for example 0, upon assertion of a start signal used to begin operation of the ring oscillator. In that instance, the change in the count value determined by the output generation circuitry can be directly deduced from the sampled count value of the transition counter circuit selected by the selection circuitry.

However, in an alternative embodiment, the initial count value comprises a previously sampled count value as sampled by the coarse sampling circuitry, and the output generation circuitry includes differentiation circuitry configured to determine the change in the count value during the reference time period by comparing the sampled count value of the transition counter circuit selected by the selection circuitry with the previously sampled count value.

In one embodiment, in addition to including an initial count value, the reference count data relating to the start of the reference time period may further comprise a previous location of the signal transition within the ring oscillator. This previous location may be predetermined, for example when using the earlier-described technique where assertion of a start signal begins operation of the ring oscillator, or alternatively the previous location may be determined from sampled signal values as previously sampled by the fine sampling circuitry.

In one embodiment, the output generation circuitry is then configured to generate the count indication by multiplying the change in the count value by the number of delay elements in said plurality of delay elements, in order to generate an intermediate result, and then to modify the intermediate result based on the current and previous locations of the signal transition within the ring oscillator.

There are a number of ways in which the current and previous locations of the signal transition within the ring oscillator can be used by the output generation circuitry. In one embodiment, the output generation circuitry is configured to generate, from the current and previous locations of the signal transition, a difference indication.

In one embodiment, the output generation circuitry is then configured, if the associated location of the transition counter circuit selected by the selection circuitry does not lie between the current and previous locations of the signal transition in a direction of propagation of the signal transition, to add the difference indication to the intermediate result to generate the count indication.

However, if the associated location of the transition counter circuit selected by the selection circuitry does lie between the current and previous locations of the signal transition in a direction of propagation of the signal transition, such an approach would not produce a correct count indication. Instead, in such a situation, the generation circuitry performs an operation equivalent to subtracting the number of delay elements in said plurality of delay elements from the intermediate result and then adding the difference indication in order to generate the count indication.

It will be appreciated that rather than directly subtracting the number of delay elements from the intermediate result, the change in the count value can be decremented by one prior to multiplication by the number of delay elements, thus generating a modified intermediate result that has been reduced by the required amount so that the difference indication can then be added directly to that modified intermediate result in order to generate the required count indication.

The number of transition counter circuits provided will vary dependent on embodiment. However, in one embodiment two transition counter circuits are provided, and both transition counter circuits are initialised to the same value prior to operation of the circuit delay monitoring apparatus such that the change in the count value is determined by the differentiation circuitry even if the transition counter circuit selected by the selection circuitry is different to the transition counter circuit that generated the previously sampled count value. This provides a simple and effective mechanism for providing a circuit delay monitoring apparatus that can provide an accurate count indication for each reference time period.

In an alternative embodiment, more than two transition counter circuits are provided, and this enables an embodiment where there is no requirement for each of the counter circuits to be initialised to the same value prior to operation of the circuit delay monitoring apparatus. In particular, in one embodiment, M is three or more, and the M transition counter circuits are connected to the ring oscillator so that, at any point in time, the separation between the current location of the signal transition and the associated location of at least two transition counter circuits will be greater than a predetermined amount. The differentiation circuitry is then configured, for any chosen reference time period, to determine the change in the count value by comparing the sampled count value of the transition counter circuit selected by the selection circuitry with the previously sampled count value of that same transition counter circuit. Hence, for such an arrangement, because there will be a safe separation between the current location of the signal transition and the associated location of at least two transition counter circuits at any particular point in time, and hence the counter values of at least two transition counter circuits can be considered to be accurate at any particular point in time, this allows the flexibility, for any chosen reference time period, to determine the change in count value with reference to current and previously sampled count values from the same transition counter circuit. Hence, it does not matter if the individual counter circuits are not initialised to the same values.

It has also been found that such an arrangement, where three or more transition counter circuits are provided, means that in the event of a single-event upset occurring in respect of a particular counter, this does not give rise to persistent errors for successive count indications output by the output generation circuitry. Having more than two counters can also relax the length requirement of the ring oscillator.

The fine sampling circuitry can be arranged in a variety of ways. However, in one embodiment the fine sampling circuitry is configured to generate a binary string from the sampled signal values at each of the plurality of sampling points, the binary string comprising a sequence of first data values followed by a sequence of second data values, and the location within the binary sequence of the transition from said first sequence to said second sequence identifies the current location of the signal transition within the ring oscillator. In one embodiment, a conversion circuit can also be provided to convert the binary sequence into a more compact binary encoding forming an output code that provides an indication of the current location of the signal transition within the ring oscillator.

The manner in which the selection circuitry interacts with the operation of the coarse sampling circuitry can vary dependent upon embodiments However, in one embodiment the coarse sampling circuitry is configured to sample the count value of each of the M transition counter circuits under control of the reference clock signal, and the selection circuitry is configured to select the sampled count value from one of those M transition counter circuits whose associated location is greater than the predetermined amount from the current location of the signal transition. Hence the output from each of the transition counter circuits is sampled in this embodiment, with the selection circuitry selecting one of the sampled count values.

The reference time period can be set as desired, but in one embodiment is one clock cycle of the reference clock signal.

The predetermined amount of separation that at any point in time will be exceeded between the associated location of at least one of the transition counter circuits and the current location of the signal transition is in one embodiment chosen having regard to setup and hold timing characteristics of circuitry within the coarse sampling circuitry used to sample the count value(s). In particular, each of the transition counters whose associated location is greater than the predetermined amount away from the current location of the signal transition can be ensured to produce an output that will not change within the setup and hold timing window of the sampling elements (e.g. flip flops) provided within the coarse sampling circuitry, and accordingly the values sampled by those sampling elements can be expected to be correct.

The manner in which the sampling points are distributed around the ring oscillator can be varied dependent upon embodiment, but in one embodiment the sampling points are regularly distributed around the ring oscillator. The number of sampling points provided can be varied dependent on embodiment, but in one embodiment the plurality of sampling points comprise a sampling point between each delay element, such that the plurality of delay elements comprise N delay elements. This provides the finest level of sampling, by in principal allowing the current location of the signal transition to be determined to the nearest delay element, give or take any small inaccuracies introduced due to outputs of individual delay elements changing during the setup or hold timing windows of the associated sampling elements within the fine sampling circuitry.

The locations at which the various transition counter circuits are connected to the ring oscillator can also be varied dependent on embodiment. However, in one embodiment, the associated locations of the M transition counter circuits are regularly spaced apart within the ring oscillator. This ensures consistency in the number of transition counter circuits whose associated location will be greater than the predetermined amount away from the current location of the signal transition at any particular point in time.

Whilst in one embodiment the reference time period equates to one clock cycle of the reference clock signal, this is not a requirement, and various other embodiments can be envisaged. For example, in one embodiment, the operation of the ring oscillator is triggered by a start signal, the M transition counter circuits are initialised to a predetermined initial count value, the previous location of the signal transition within the ring oscillator is predetermined, and the reference time period is a time period between assertion of the start signal, and a predetermined clock edge of the reference clock signal (providing a stop trigger). Such an embodiment may be useful, for example, where it is desired to determine the time between two particular events, the start signal being triggered by the first event, and the predetermined clock edge of the reference clock signal being triggered by the second event.

Viewed from a second aspect, the present invention provides a method of monitoring circuit delay comprising: propagating a signal transition through a ring oscillator comprising a plurality of delay elements; sampling, under control of a reference clock signal, signal values at each of a plurality N of sampling points distributed around the ring oscillator, in order to generate an indication of a current location of the signal transition within the ring oscillator; connecting each of M transition counter circuits, where M is at least 2 and less than N, to an associated location within the ring oscillator, the M transition counter circuits being connected to the ring oscillator so that, at any point in time, the separation between the current location of the signal transition and the associated location of at least one of said M transition counter circuits will be greater than a predetermined amount; within each transition counter circuit, incrementing a count value each time the signal transition passes the associated location; sampling the count value under control of the reference clock signal; selecting, in dependence on the indication of the current location of the signal transition, one of said M transition counter circuits whose associated location is greater than said predetermined amount from the current location of the signal transition; and generating a count indication for a reference time period dependent on a sampled count value of the transition counter circuit selected by the selection circuitry, the indication of the current location of the signal transition within the ring oscillator, and reference count data relating to the start of the reference time period.

Viewed from a third aspect, the present invention provides a circuit delay monitoring apparatus comprising: ring oscillator means comprising a plurality of delay elements, a signal transition being propagated through the delay elements of the ring oscillator means; a plurality N of sampling points distributed around the ring oscillator means; fine sampling means for sampling signal values at each of the plurality of sampling points under control of a reference clock signal, in order to generate an indication of a current location of the signal transition within the ring oscillator means; coarse sampling means comprising M transition counter means, where M is at least 2 and less than N, each transition counter means for connecting to an associated location within the ring oscillator means and for incrementing a count value each time the signal transition passes the associated location, the coarse sampling means further for sampling the count value under control of the reference clock signal, the M transition counter means being connected to the ring oscillator means so that, at any point in time, the separation between the current location of the signal transition and the associated location of at least one of said M transition counter means will be greater than a predetermined amount; selection means for selecting, in dependence on the indication of the current location of the signal transition generated by the fine sampling means, one of said M transition counter means whose associated location is greater than said predetermined amount from the current location of the signal transition; and output generation means for generating a count indication for a reference time period dependent on a sampled count value of the transition counter means selected by the selection means, the indication of the current location of the signal transition within the ring oscillator means, and reference count data relating to the start of the reference time period.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 2:
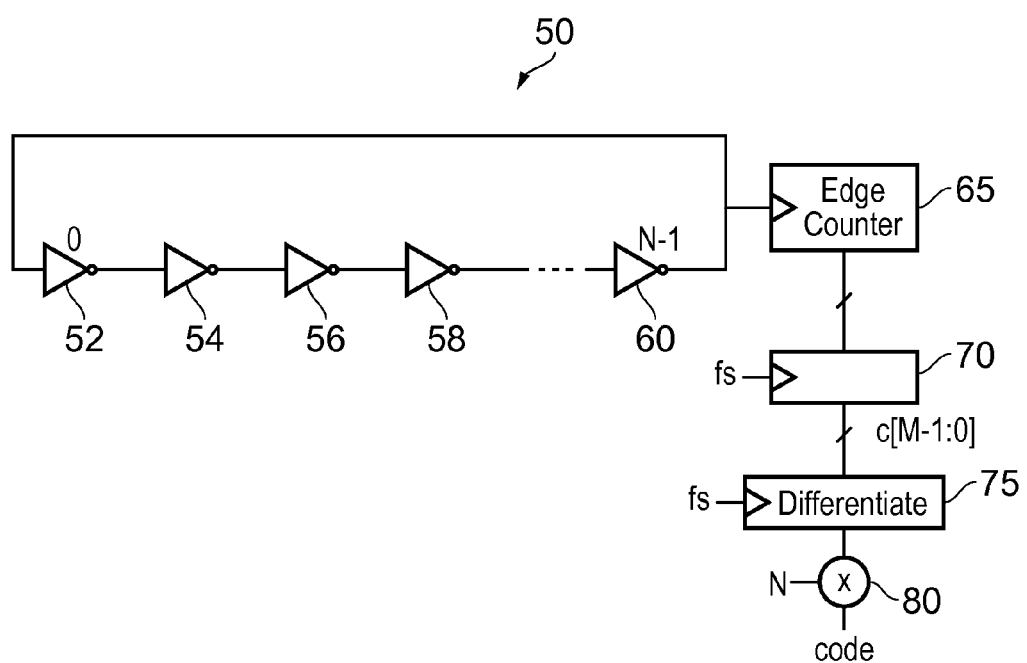
FIG. 2 illustrates the arrangement of a further known circuit delay monitoring apparatus.
Figure 3A:
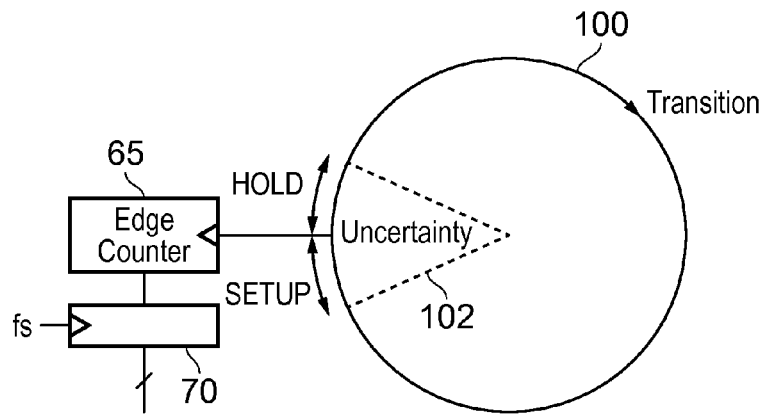
FIGS. 3A to 3C illustrate timing issues that can give rise to potential inaccuracies in the sampled output of edge counters used to increment a count value each time a signal transition passes an associated location within a ring oscillator.

FIG. 3A illustrates a timing issue that can arise when using an edge counter 65 connected to a ring oscillator, depending on the relationship between the time at which the signal transition passes the associated location at which the edge counter 65 is connected into the ring oscillator and the timing at which the sampling circuitry 70 samples the output of the edge counter 65 based on the supplied clock signal fs. The circle 100 denotes the propagation of the signal transition around the ring oscillator. The uncertainty region 102 represents a range of distance around the associated location that the edge counter 65 is connected to the ring oscillator, such that if the signal transition is within that uncertainty region 102 at the time the clock signal fs is asserted, there is a prospect that the edge counter's 65 output will be changing during the setup or hold timing window of the flip flops within the sampling circuitry 70. As a result, there is the prospect of one or more of the flip flops sampling an incorrect or metastable value. It is this problem that gives rise to the inaccuracy issues associated with the known prior art approach of FIG. 2, and because the edge counter only increments the count value once per propagation of the signal transition around the entire ring oscillator, this can give rise to a sampled value that is inaccurate by N delay elements, assuming there are N delay elements within the ring oscillator.

Figure 3B:
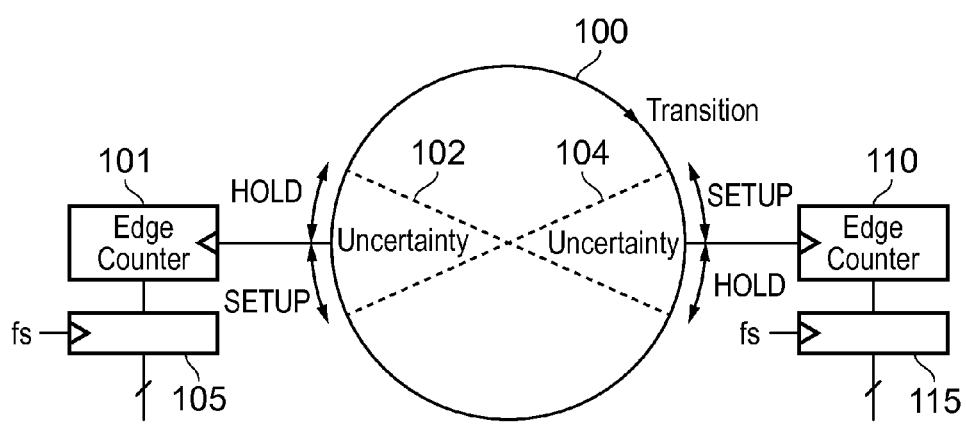

The inventors of the present invention realised that this problem could be addressed if multiple edge counters were connected into the ring oscillator at different locations, provided there was also a mechanism to decide at any particular point in time which edge counter's output could be trusted to be correct, i.e. is guaranteed not to be in the process of changing at the time it is sampled. FIG. 3B illustrates the situation where two edge counters 101, 110 are connected into the ring oscillator, at associated locations separated by half the ring oscillator from each other. There is an uncertainty range 102 associated with the edge counter 101, and a separate uncertainty range 104 associated with the edge counter 110. Both edge counters 101, 110 have associated sampling circuits 105, 115. It will be appreciated that if at any point the signal transition is within the uncertainty range 104, it cannot also at that time be within the uncertainty range 102, and vice versa. Accordingly, at any point in time there will only be a maximum of one edge counter whose output might be changing at the time the associated sampling circuitry is seeking to sample the output.

Figure 3C:
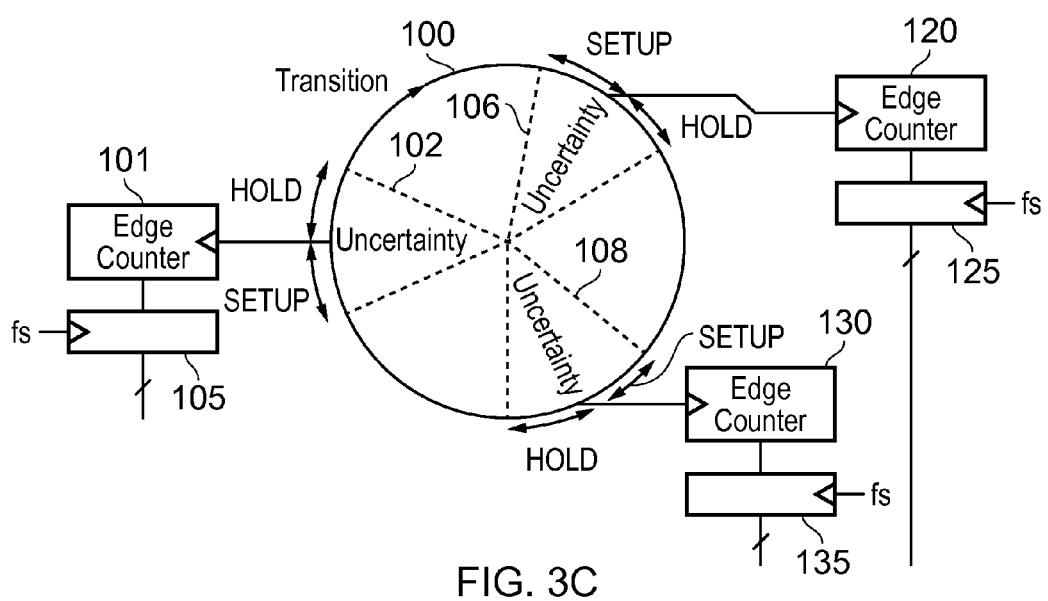

FIG. 3C illustrates another embodiment where three edge counters, 101, 120, 130 are connected into the ring, each being separated from the other by an equal distance equivalent to a third of the distance around the ring oscillator. Each edge counter 101, 120, 130, has an associated uncertainty region 102, 106, 108, and each edge counter has associated sampling circuits 105, 125, 135. Again, it will be appreciated that the signal transition can at worst only be within one of the uncertainty regions at a time, and accordingly the output from two edge counters can be trusted at any point in time.

Figure 4:
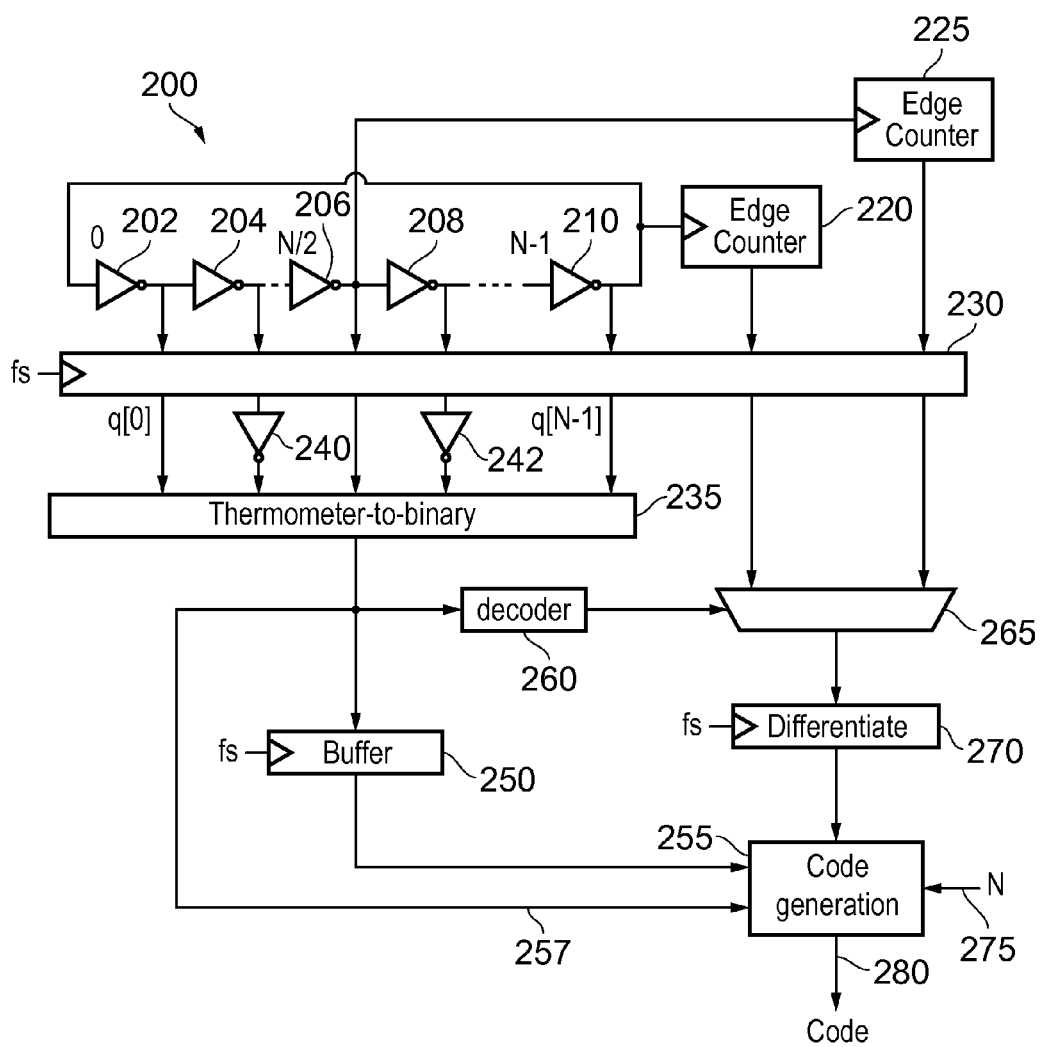
FIG. 4 is a diagram illustrating a circuit delay monitoring apparatus in accordance with one embodiment.

Based on the principals of FIGS. 3B and 3C, the inventors realised that an improvement in the accuracy of a circuit delay monitoring apparatus could be achieved if multiple edge counters were connected to a ring oscillator, but that it would be necessary to be able to determine at any particular point in time which edge counter's output could be safely sampled without risk of error. FIG. 4 illustrates the arrangement of a circuit delay monitoring apparatus in accordance with one embodiment, where two edge counters were used, and a mechanism is provided for deciding at any particular point in time which edge counter's output is safe to use when generating a count indication for the reference time period.

As shown in FIG. 4, a ring oscillator 200 consists of a plurality of delay elements 202, 204, 206, 208, 210, in this embodiment the delay elements being formed of inverters. Two edge counters 220, 225 are connected to associated locations within the ring oscillator, in this embodiment those locations being essentially evenly spaced from each other within the ring oscillator. In practice, due to there being an odd number of delay elements within the ring oscillator, they will not be exactly separated by half the ring oscillator length. A series of sampling circuits 230, are provided, in one embodiment the sampling circuits including a series of flip flops controlled by a clock signal fs. A series of sampling points are provided, one in association with the output of each of the delay elements 202, 204, 206, 208, 210, with those sampling points providing an input to associated flip flops within the sampling circuitry 230.

Figure 1:
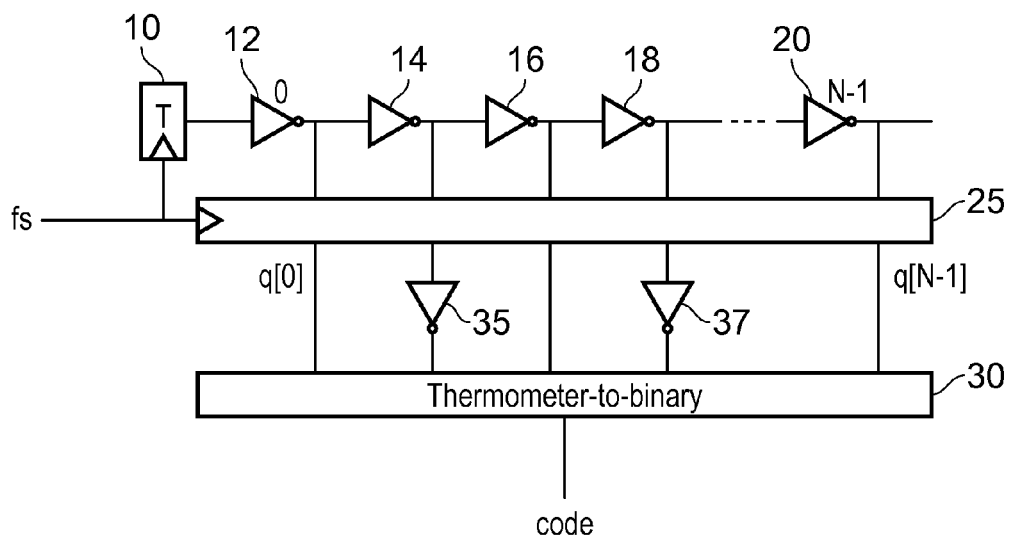
FIG. 1 illustrates the arrangement of one known circuit delay monitoring apparatus.

A series of flip flops configured to receive the outputs from the sampling points can be considered to form fine sampling circuitry used to sample the signal value at each of the sampling points, with that sampled information then being used to generate an indication of the current location of the signal transition within the ring oscillator. In particular, the output of each of those flip flops is passed to the thermometer-to-binary circuitry 235, with the output from each alternate flip flop being passed to an inverter 240, 242. Hence, the input to the thermometer-to-binary circuitry 235 will be a binary string of bits, where a first sequence of the bits has a first value, and a second sequence of bits then has the opposite value. The position of the transition between those two sequences then indicates a current location of the signal transition within the ring oscillator. In much the same way as the thermometer-to-binary circuitry 30 of FIG. 1, the thermometer-to-binary 235 of FIG. 4 can then convert that thermometer value into a more compact binary encoding to be output representative of the current location of the signal transition.

As shown in FIG. 4, this output code is provided to a buffer 250, and also to the decoder 260. The decoder 260 determines based on the output from the thermometer-to-binary circuitry 235, and knowledge of the locations at which the edge counters 220, 225 are connected into the ring oscillator, which edge counter is furthest from the current location of the signal transition, and issues a control signal to the multiplexer 265 accordingly.

Flip flops within the sampling circuitry 230 form part of coarse circuitry to sample the outputs of each of the edge counters 220, 225, under the control of the clock signal fs. The sampled outputs are then provided as inputs to the multiplexer 265. Based on the control signal received via the decoder, one of those input signals will be output to the differentiation circuitry 270.

In the embodiment illustrated in FIG. 4, the differentiation circuitry 270 includes some local buffering circuitry to buffer the previously received input from the multiplexer 265 and is arranged to resample the output from the multiplexer 265 in dependence on the clock signal fs. In this embodiment, it is assumed that each of the edge counters 220, 225 is initialised to the same value, and hence the differentiation logic 270 can merely subtract a currently sampled count value from the previously sampled count value in order to determine a change in the count value that has occurred in a referenced time period, in this embodiment it being assumed that the reference time period is the period between two corresponding edges of the clock signal fs, for example between two rising edges of the clock signal. The change in the count value as determined by the differentiation circuitry 270 is then provided to the code generation circuitry 255.

As shown in FIG. 4, the code generation circuitry 255 also receives the current output from the thermometer-to-binary circuitry 235, along with the output from the buffer 250 representing the previously received output from the thermometer-to-binary circuitry 235. Based on the current output from the thermometer-to-binary circuitry 235 received over path 257, and the output from the buffer 250, the code generation circuitry can determine a difference indication, in particular this representing the number of delay elements over and above any full laps of the ring oscillator traversed by the signal transition in the referenced time period.

The code generation circuitry 255 also receives the value N over the path 275, i.e. an indication of the number of delay elements in the ring oscillator 200. Based on this information, the code generation circuitry 255 can then generate an output code over path 280 indicative of the total number of delay elements traversed by the signal transition in the reference time period.

The computation performed by the code generation circuitry 255 will depend on the current location of the signal transition as indicated over path 257, the previous location of the signal transition as indicated by the output from the buffer 250, and the location at which the selected edge counter is located within the ring oscillator. In particular, if the location of the selected edge counter does not lie in the path of the signal transition between the previous location of the signal transition and the current location of the signal transition, then the difference between the current and previous locations of the signal transition is added to an intermediate result obtained by multiplying the output from the differentiation circuitry 270 by the value N. The resultant value is output as a code over path 280, and indicates the total number of delay elements traversed by the signal transition in the reference time period.

However, if the location of the selected edge counter does lie between the previous location of the signal transition and the current location of the signal transition in the direction of travel of the signal transition, then in one embodiment the code generation logic subtracts one from the value output from the differentiation circuitry 270, before multiplying the resultant value by N. This produces an intermediate result which is N less than would be the case had the output from the differentiation circuitry 270 been used directly. With this adjustment, then the difference between the current location and the previous location of the signal transition can be added to the resultant intermediate value in order to produce an output code over path 280 which represents the total number of delay elements traversed by the signal transition in the reference time period.

In summary, by decoding the fine code output by the thermometer-to-binary circuitry 235, it is possible to determine where the signal transition is currently within the ring oscillator. Further, since the two counters 220, 225 are equidistant apart within the ring oscillator, the transition can only affect one of the counters at any synchronisation instant, assuming N is not too small. Both counters are sampled using the clock signal fs, and after decoding the fine code in order to locate the signal transition, the decoder selects the counter which is safe to be sampled and hence used for the generation of the subsequent output code by the code generation circuitry 255, on a cycle-by-cycle basis. If the ring oscillator is sufficiently long, this approach prevents metastability entirely. There can still be some errors in sampling of the fine bits, for the reasons discussed earlier with reference to the prior art approach of FIG. 1, but this is typically limited to one position and has a much smaller consequence than any error in the output counter values.

Figure 5:
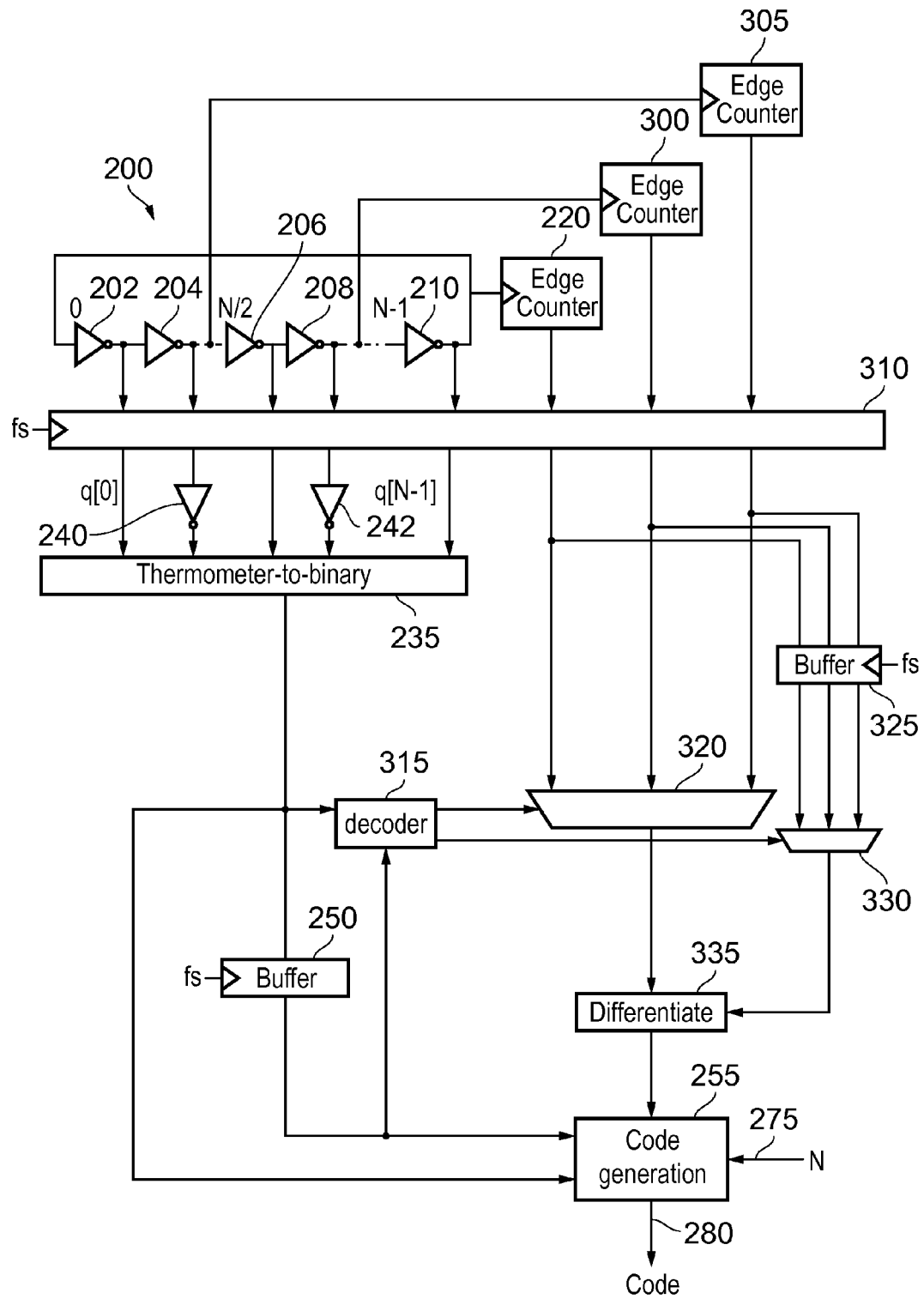
FIG. 5 is a diagram illustrating a circuit delay monitoring apparatus in accordance with an alternative embodiment.

FIG. 5 illustrates an alternative embodiment where three edge counters 220, 300, 305 are used. The ring oscillator 200 is the same as in FIG. 4, as is the fine sampling circuitry. The output from each of the edge counters 220, 300, 305 is sampled by flip flops within the sampling circuits 310, in accordance with the supplied clock signal fs. The sampled values are provided to a multiplexer 320, and in addition are routed to a buffer 325. The outputs from the buffer are provided to another multiplexer 330. As a result, the multiplexer 320 will receive the sampled outputs from the edge counters for a current clock cycle, whilst the multiplexer 330 will receive the equivalent values as sampled in the previous clock cycle.

The decoder circuitry 315 receives the output from the thermometer-to-binary circuitry 235 as before, but in addition receives the output from the buffer 250 indicating the previous location of the signal transition.

As discussed with reference to the previous FIG. 3C, at any point in time the output from at least two of the edge counters is safe to use, since it will be known that the output from those edge counters will not be changing at the time the output is sampled. Having regard to the current location of the signal transition, and the previous location, the decoder can determine one of the edge counters that was safe to use both in the previous clock cycle and the current clock cycle, and as a result of that determination sends appropriate control signals to the multiplexers 320, 330, in order to select one of their inputs as an output to provide to the differentiation circuitry 335.

The differentiation circuitry hence receives two inputs, one representing the sampled count value of the selected edge counter for the current cycle, and the other representing the previously sampled count value from that same edge counter. The differentiation circuitry 335 then determines the difference between those two values in order to provide an indication of the change in the count value to the code generation circuitry 255. Since the differentiation circuitry 335 is at any point in time provided with the required two inputs, it does not itself need to be clocked. The code generation circuitry 255 then operates in an identical manner to that discussed earlier with reference to FIG. 4 in order to generate an output code over path 280.

Since at any point in time the differentiation circuitry 335 determines the difference between edge count values from the same edge counter there is no requirement for the edge counters 220, 300, 305 to be initialised to the same value prior to operation of the ring oscillator 200. Furthermore, by such an approach, any single-event upset that may impact an individual counter, causing a sampled output value from that counter to be incorrect, will not cause persistent errors. Storage elements in data processing systems are susceptible to single event upsets (SEUs). A range of phenomena may give rise to an SEU that causes a change of state in the stored data, for example this may be due to ions or electromagnetic radiation striking a sensitive node within the device and causing the state to flip.

If, for example, a single event upset caused the output from the edge counter 220 at a particular point in time to be out by a value of one, then this could cause a slight inaccuracy in the output from the code generation circuitry 255 if the output from that edge counter was being used at that point in time. However, it would have no further effect on subsequent output codes 280. In particular, it would have no effect on any subsequent outputs generated based on differences between the counter values sampled from the other edge counters 300, 305. Furthermore, for any subsequent iterations where the output from the edge counter 220 is used, the difference between a current sampled value and a previous sampled value would still be correct, even if the absolute value had become unreliable by virtue of the single event upset.

Figure 6:
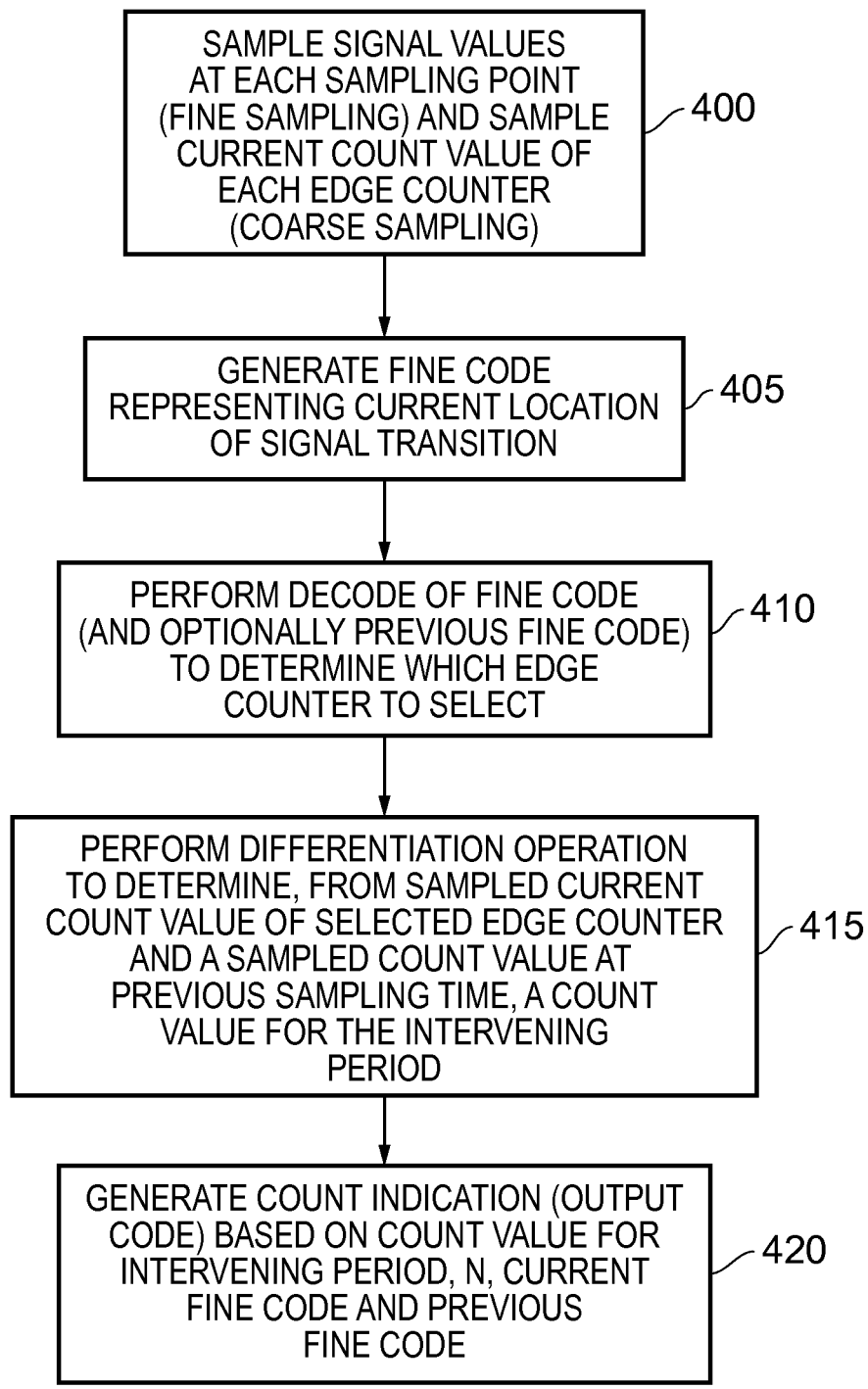
FIG. 6 is a flow diagram illustrating the general operation of the circuitry of FIG. 4 or 5 in accordance with one embodiment.

FIG. 6 is a flow diagram illustrating the steps performed by the circuits of FIG. 4 or FIG. 5. At step 400, the signal value at each of the sampling points within the ring oscillator 200 is sampled (referred to herein as fine sampling), and in addition the current count value of each edge counter is sampled (referred to herein as coarse sampling). At step 405 a fine code is then generated representing the current location of the signal transition within the ring oscillator. Thereafter at step 410, the decode of the output fine code is performed in order to determine which edge counter to select. In the embodiment of FIG. 5, this decode operation will also have reference to the previously output fine code in order to select one edge counter which was both safe to sample at the current time, and at the time the previous fine code was generated.

Having selected the edge counter, then at step 415 a differentiation operation is performed in order to determine, from the current sampled count value of that selected edge counter and a sampled count value at a previous sampling time, a count value for the intervening period, also referred to herein as a change in the count value. Thereafter, at step 420, the code generation circuitry 255 is configured to generate an output count indication (also referred to herein as an output code) based on the count value for the intervening period, the parameter N, and both the current fine code and the previous fine code (indicating the current location of the signal transition and the previous location of the signal transition, respectively).

Figure 7:
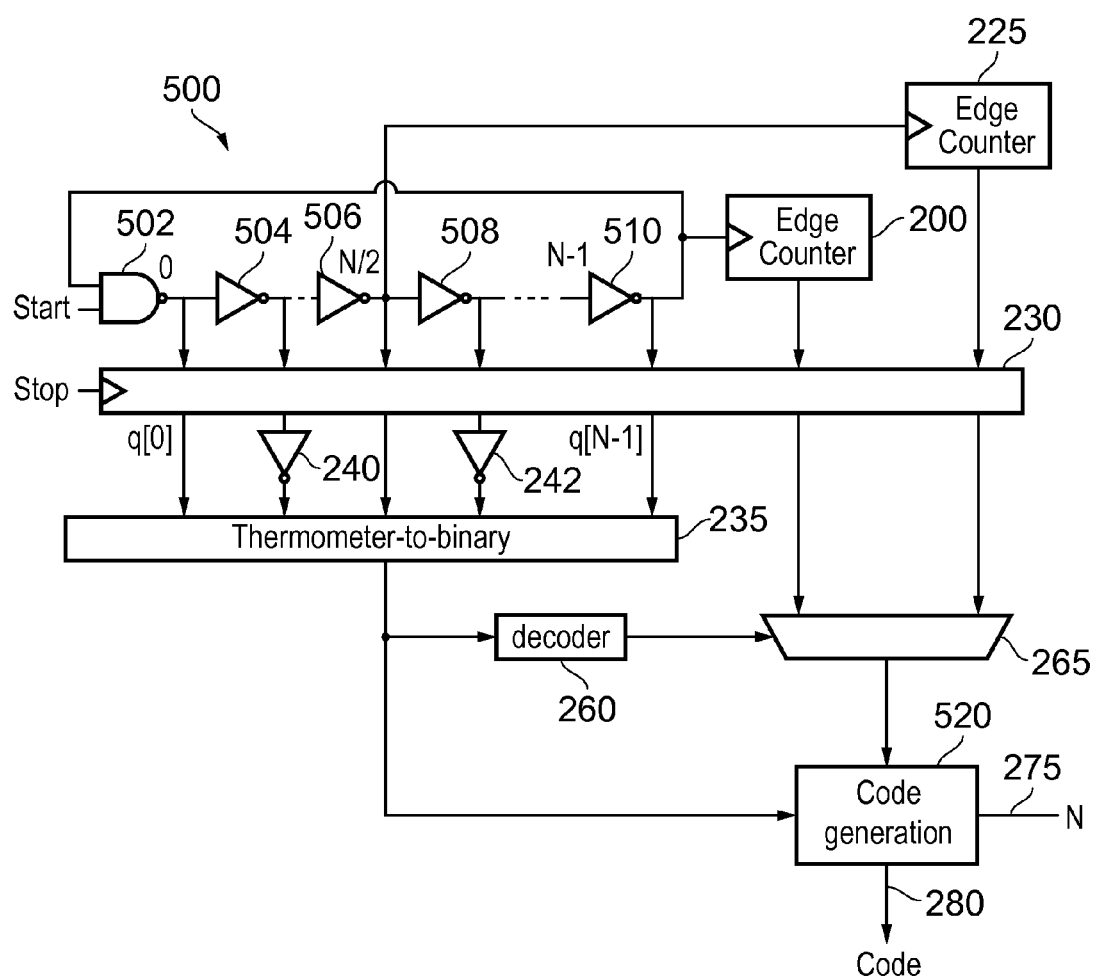
FIG. 7 is a diagram illustrating a circuit delay monitoring apparatus in accordance with a further alternative embodiment.

In the example of FIGS. 4 and 5, it is assumed that the ring oscillator is continuously operating, and that the reference time period for which count information is generated is determined to be an integer number of clock cycles of the clock signal fs (for example one clock cycle of the clock signal fs). However, in an alternative embodiment, the reference time period can be determined by a start signal and a stop signal. In particular, as shown in FIG. 7, the ring oscillator 500 consists of a series of delay elements 502, 504, 506, 508, 510. The delay elements are implemented as inverters, with the exception of one delay element 502, which is configured as a NAND gate. It will appreciated that whilst the start signal is disabled at a logic zero value, the output from the NAND gate will always be a logic one value, and accordingly a steady state will exist within the ring oscillator where a signal transition is not being propagated. However, when the start signal is asserted at a logic one value, this will cause the output from the NAND gate to transition to a logic zero value, and accordingly insert a signal transition into the ring oscillator for propagation around the ring oscillator. The start signal will continue to be asserted for the entire period for which a count value is required, hence causing the NAND gate 502 to operate as an inverter for that period, and thus allowing the ring oscillator 500 to operate as a ring oscillator.

The sampling circuits 230 are operated by a stop signal, which when asserted causes the various flip flops within the sampling circuitry to sample the current values at each of the sampling points, and also the current values of each of the edge counters.

From a comparison of FIG. 7 with FIG. 4, it will appreciated that the decoder 260 and multiplexer 265 operate in exactly the same way as discussed previously for FIG. 4. However, since the start location of the signal transition is known (i.e. it is at the output of the NAND gate 502), there is no need for the buffer 250 that was provided in FIG. 4, and instead the code generation circuitry will treat the output from the thermometer-to-binary circuitry 235 as identifying directly the difference between the current location of the signal transition (i.e. at the time of sampling based on the stop signal) and the previous location of the signal transition.

Furthermore, the edge counters 200, 225 will be initialised to a predetermined value, for example zero, prior to the start signal being asserted, and so differentiation circuitry is not required to modify the output from the multiplexer 265. Instead, the value provided from the multiplexer can be treated directly as identifying the change in the count value during the reference time period. The code generation circuitry 520 then operates in essentially the same manner as described earlier with reference to the code generation circuitry 255 of FIG. 4.

From the above described embodiments, it will be seen that such embodiments provide a synchronisation technique for accurately sampling a ring oscillator using an asynchronous timing reference. The technique provides both a high resolution and a high bandwidth circuit delay monitoring circuitry. When using the techniques of the described embodiments, the inaccuracy issues associated with known prior art ring oscillator-based approaches are addressed, without the requirement to seek to average the outputs from the circuitry over multiple cycles.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A circuit delay monitoring apparatus comprising:
   a ring oscillator comprising a plurality of delay elements, a signal transition being propagated through the delay elements of the ring oscillator;
   a plurality N of sampling points distributed around the ring oscillator;
   fine sampling circuitry configured to sample signal values at each of the plurality of sampling points under control of a reference clock signal, in order to generate an indication of a current location of the signal transition within the ring oscillator;
   coarse sampling circuitry comprising M transition counter circuits, where M is at least 2 and less than N, each transition counter circuit being connected to an associated location within the ring oscillator and configured to increment a count value each time the signal transition passes the associated location, the coarse sampling circuitry being configured to sample the count value under control of the reference clock signal, the M transition counter circuits being connected to the ring oscillator so that, at any point in time, the separation between the current location of the signal transition and the associated location of at least one of said M transition counter circuits will be greater than a predetermined amount;
   selection circuitry configured to select, in dependence on the indication of the current location of the signal transition generated by the fine sampling circuitry, one of said M transition counter circuits whose associated location is greater than said predetermined amount from the current location of the signal transition; and
   output generation circuitry configured to generate a count indication for a reference time period dependent on a sampled count value of the transition counter circuit selected by the selection circuitry, the indication of the current location of the signal transition within the ring oscillator, and reference count data relating to the start of the reference time period.

2. A circuit delay monitoring apparatus as claimed in claim 1, wherein:
   the reference count data relating to the start of the reference time period comprises an initial count value; and
   the output generation circuitry is configured to determine a change in the count value during the reference time period by comparing the sampled count value of the transition counter circuit selected by the selection circuitry with the initial count value.

3. A circuit delay monitoring apparatus as claimed in claim 2, wherein:
   the initial count value comprises a previously sampled count value as sampled by the coarse sampling circuitry; and
   the output generation circuitry includes differentiation circuitry configured to determine the change in the count value during the reference time period by comparing the sampled count value of the transition counter circuit selected by the selection circuitry with said previously sampled count value.

4. A circuit delay monitoring apparatus as claimed in claim 2, wherein:
   the reference count data relating to the start of the reference time period further comprises a previous location of the signal transition within the ring oscillator; and
   the output generation circuitry is configured to generate the count indication by multiplying the change in the count value by the number of delay elements in said plurality of delay elements, in order to generate an intermediate result, and then to modify the intermediate result based on the current and previous locations of the signal transition within the ring oscillator.

5. A circuit delay monitoring circuitry as claimed in claim 4, wherein the output generation circuitry is configured to generate, from the current and previous locations of the signal transition, a difference indication.

6. A circuit delay monitoring circuitry as claimed in claim 5, wherein the output generation circuitry is configured, if the associated location of the transition counter circuit selected by the selection circuitry does not lie between the current and previous locations of the signal transition in a direction of propagation of the signal transition, to add the difference indication to the intermediate result to generate the count indication.

7. A circuit delay monitoring circuitry as claimed in claim 5, wherein the output generation circuitry is configured, if the associated location of the transition counter circuit selected by the selection circuitry does lie between the current and previous locations of the signal transition in a direction of propagation of the signal transition, to perform an operation equivalent to subtracting the number of delay elements in said plurality of delay elements from the intermediate result and then adding the difference indication in order to generate the count indication.

8. A circuit delay monitoring apparatus as claimed in claim 3, wherein M is 2, and both transition counter circuits are initialised to the same value prior to operation of the circuit delay monitoring apparatus such that the change in the count value is determined by the differentiation circuitry even if the transition counter circuit selected by the selection circuitry is different to the transition counter circuit that generated the previously sampled count value.

9. A circuit delay monitoring apparatus as claimed in claim 3, wherein:
   M is 3 or more, and the M transition counter circuits are connected to the ring oscillator so that, at any point in time, the separation between the current location of the signal transition and the associated location of at least two transition counter circuits will be greater than a predetermined amount;
   the differentiation circuitry is configured, for any chosen reference time period, to determine the change in the count value by comparing the sampled count value of the transition counter circuit selected by the selection circuitry with the previously sampled count value of that same transition counter circuit.

10. A circuit delay monitoring apparatus as claimed in claim 1, wherein the fine sampling circuitry is configured to generate a binary string from the sampled signal values at each of the plurality of sampling points, the binary string comprising a sequence of first data values followed by a sequence of second data values, and the location within the binary sequence of the transition from said first sequence to said second sequence identifies the current location of the signal transition within the ring oscillator.

11. A circuit delay monitoring circuitry as claimed in claim 1, wherein the coarse sampling circuitry is configured to sample the count value of each of said M transition counter circuits under control of the reference clock signal, and the selection circuitry is configured to select the sampled count value from one of said M transition counter circuits whose associated location is greater than said predetermined amount from the current location of the signal transition.

12. A circuit delay monitoring circuitry as claimed in claim 1, wherein the reference time period is one clock cycle of the reference clock signal.

13. A circuit delay monitoring circuitry as claimed in claim 1, wherein said predetermined amount is chosen having regard to setup and hold timing characteristics of circuitry within the coarse sampling circuitry used to sample the count value.

14. A circuit delay monitoring circuitry as claimed in claim 1, wherein the sampling points are regularly distributed around the ring oscillator.

15. A circuit delay monitoring circuitry as claimed in claim 14, wherein said plurality of sampling points comprise a sampling point between each delay element, such that said plurality of delay elements comprise N delay elements.

16. A circuit delay monitoring circuitry as claimed in claim 1, wherein said associated locations of said M transition counter circuits are regularly spaced apart within the ring oscillator.

17. A circuit delay monitoring circuitry as claimed in claim 4, wherein:
the operation of the ring oscillator is triggered by a start signal;
the M transition counter circuits are initialised to a predetermined initial count value;
the previous location of the signal transition within the ring oscillator is predetermined; and
the reference time period is a time period between assertion of said start signal, and a predetermined clock edge of said reference clock signal.

18. A method of monitoring circuit delay comprising:
propagating a signal transition through a ring oscillator comprising a plurality of delay elements;
sampling, under control of a reference clock signal, signal values at each of a plurality N of sampling points distributed around the ring oscillator, in order to generate an indication of a current location of the signal transition within the ring oscillator;
connecting each of M transition counter circuits, where M is at least 2 and less than N, to an associated location within the ring oscillator, the M transition counter circuits being connected to the ring oscillator so that, at any point in time, the separation between the current location of the signal transition and the associated location of at least one of said M transition counter circuits will be greater than a predetermined amount;
within each transition counter circuit, incrementing a count value each time the signal transition passes the associated location;
sampling the count value under control of the reference clock signal;
selecting, in dependence on the indication of the current location of the signal transition, one of said M transition counter circuits whose associated location is greater than said predetermined amount from the current location of the signal transition; and
generating a count indication for a reference time period dependent on a sampled count value of the transition counter circuit selected by the selection circuitry, the indication of the current location of the signal transition within the ring oscillator, and reference count data relating to the start of the reference time period.

19. A circuit delay monitoring apparatus comprising:
ring oscillator means comprising a plurality of delay elements, a signal transition being propagated through the delay elements of the ring oscillator means;
a plurality N of sampling points distributed around the ring oscillator means;
fine sampling means for sampling signal values at each of the plurality of sampling points under control of a reference clock signal, in order to generate an indication of a current location of the signal transition within the ring oscillator means;
coarse sampling means comprising M transition counter means, where M is at least 2 and less than N, each transition counter means for connecting to an associated location within the ring oscillator means and for incrementing a count value each time the signal transition passes the associated location, the coarse sampling means further for sampling the count value under control of the reference clock signal, the M transition counter means being connected to the ring oscillator means so that, at any point in time, the separation between the current location of the signal transition and the associated location of at least one of said M transition counter means will be greater than a predetermined amount;
selection means for selecting, in dependence on the indication of the current location of the signal transition generated by the fine sampling means, one of said M transition counter means whose associated location is greater than said predetermined amount from the current location of the signal transition; and
output generation means for generating a count indication for a reference time period dependent on a sampled count value of the transition counter means selected by the selection means, the indication of the current location of the signal transition within the ring oscillator means, and reference count data relating to the start of the reference time period.

* * * * *